(12) United States Patent
Eshel et al.

(10) Patent No.: US 10,594,967 B2
(45) Date of Patent: Mar. 17, 2020

(54) SAMPLE-AND-HOLD CIRCUIT WITH RTS NOISE REDUCTION BY PERIODIC MODE SWITCHING

(71) Applicant: Sony Corporation, Tokyo (JP)

(72) Inventors: Noam Eshel, Pardesia (IL); Golan Zeituni, Kfar-saba (IL)

(73) Assignee: Sony Corporation, Tokyo (JP)

( * ) Notice: Subject to any disclaimer, the term of this patent is extended or adjusted under 35 U.S.C. 154(b) by 119 days.

(21) Appl. No.: 15/887,162

(22) Filed: Feb. 2, 2018

(65) Prior Publication Data

US 2018/0160063 A1 Jun. 7, 2018

Related U.S. Application Data

(63) Continuation of application No. 15/198,832, filed on Jun. 30, 2016, now Pat. No. 9,930,274.

(51) Int. Cl.
*H04N 5/363* (2011.01)
*H04N 5/378* (2011.01)
*H04N 5/3745* (2011.01)
*G11C 27/02* (2006.01)
*H04N 5/374* (2011.01)
*H03K 5/08* (2006.01)

(52) U.S. Cl.
CPC .......... *H04N 5/363* (2013.01); *G11C 27/026* (2013.01); *H03K 5/08* (2013.01); *H04N 5/374* (2013.01); *H04N 5/378* (2013.01); *H04N 5/37455* (2013.01); *H04N 5/37457* (2013.01)

(58) Field of Classification Search
CPC .... H04N 5/363; H04N 5/37457; H04N 5/374; H04N 5/37455; H04N 5/378; H03K 5/08; G11C 27/026
See application file for complete search history.

(56) References Cited

U.S. PATENT DOCUMENTS

| | | | |
|---|---|---|---|
| 2007/0091191 A1 | 4/2007 | Oike | |
| 2011/0267505 A1 | 11/2011 | Dierickx | |
| 2014/0036118 A1* | 2/2014 | Dowaki | H04N 5/2173 348/294 |
| 2015/0054476 A1* | 2/2015 | Yang | G05F 1/625 323/268 |
| 2016/0140898 A1 | 5/2016 | Hyun et al. | |

\* cited by examiner

*Primary Examiner* — Mekonnen D Dagnew
(74) *Attorney, Agent, or Firm* — Michael Best & Friedrich LLP

(57) ABSTRACT

A sample-and-hold-circuit includes an amplifier transistor, a resistor connected between a source terminal of the amplifier and a voltage, a first switch connected in parallel with the resistor, and a second switch connected between a gate terminal of the amplifier transistor and the voltage. When the first switch is closed and the second switch is open, the amplifier transistor is in an inversion mode; and when the first switch is open and the second switch is closed, the amplifier transistor is in an accumulation mode.

20 Claims, 9 Drawing Sheets

SAMPLE-AND-HOLD CIRCUIT WITH RTS NOISE REDUCTION BY PERIODIC MODE SWITCHING

BACKGROUND OF THE INVENTION

1. Field of the Invention

The present invention is a Continuation of application Ser. No. 15/198,832, filed Jun. 30, 2016, the entire contents of which are incorporated herein by reference.

This application relates generally to sample-and-hold circuits. More specifically, this application relates to a sample-and-hold circuit that can reduce the effects of RTS noise in image sensing or other electronic applications.

2. Description of Related Art

Image sensing devices typically consist of an image sensor, generally an array of pixel circuits, as well as signal processing circuitry and any associated control or timing circuitry. Within the image sensor itself, charge is collected in a photoelectric conversion device of the pixel circuit as a result of the impingement of light.

One example of a pixel circuit is illustrated in FIG. 1. As shown in FIG. 1, a pixel circuit 100 includes a photoelectric conversion device 101 (for example, a photodiode), a floating diffusion FD, a transfer transistor 102, a reset transistor 103, an amplification transistor 104, and a selection transistor 105, and a vertical signal line 106. As illustrated, vertical signal line 106 is common to a plurality of pixel circuits within the same column. Alternatively, a vertical signal line may be shared among multiple columns. Gate electrodes of transfer transistor 102, reset transistor 103, and selection transistor 105 receive signals TRG, RST, and SEL, respectively. These signals may, for example, be provided by the control or timing circuitry.

While FIG. 1 illustrates a pixel circuit having four transistors in a particular configuration, the current disclosure is not so limited and may apply to a pixel circuit having fewer or more transistors as well as other elements, such as capacitors, resistors, and the like. Additionally, the current disclosure may be extended to configurations where one or more transistors are shared among multiple photoelectric conversion devices.

The accumulated charge is then converted to a digital value. Such a conversion typically requires several circuit components such as sample-and-hold (S/H) circuits, analog-to-digital converters (ADC), and timing and control circuits, with each circuit component serving a purpose in the conversion. For example, the purpose of the S/H circuit may be to sample the analog signals from different time phases of the photo diode operation, after which the analog signals may be converted to digital form by the ADC.

However, in high-resolution image sensors, it is desirable to keep the noise source in the various circuit components to a minimum. A significant noise source in typical sample-and-hold circuit implementations is the 1/f noise in a MOS transistor; for example, an NMOS transistor. Such noise originates from the oxide-trap-induced charge mobility fluctuations of the transistor. For MOS transistors with a small channel area, such as those used in some sample-and-hold circuits, the capture and emission of a carrier by the trap results in a current that resembles a random telegraph signal ("RTS"). The RTS noise in the S/H transistor appears as pixel noise in the resulting images and thus has a significant impact on the image quality of the sensor. Therefore, there exists a need for a method of signal processing that can reduce the impact of RTS noise.

BRIEF SUMMARY OF THE INVENTION

Various aspects of the present disclosure relate to a sample-and-hold circuit that is switchable between operation in an inversion mode and operation in an accumulation mode.

In one aspect of the present disclosure, a sample-and-hold circuit includes an amplifier transistor, a resistor connected between a source terminal of the amplifier and a predetermined voltage, a first switch connected in parallel with the resistor, and a second switch connected between a gate terminal of the amplifier transistor and the predetermined voltage.

In another aspect of the present disclosure, an image sensor includes a pixel circuit configured to convert incident light into an analog signal; and a sample-and-hold circuit configured to receive the analog signal, wherein the sample-and-hold circuit includes an amplifier transistor, a resistor connected between a source terminal of the amplifier and a predetermined voltage, a first switch connected in parallel with the resistor, and a second switch connected between a gate terminal of the amplifier transistor and the predetermined voltage.

In the above aspects of the present disclosure, when the first switch is closed and the second switch is open, the amplifier transistor is in an inversion mode; and when the first switch is open and the second switch is closed, the amplifier transistor is in an accumulation mode.

This disclosure can be embodied in various forms, including hardware or circuits controlled by computer-implemented methods, computer program products, computer systems and networks, user interfaces, and application programming interfaces; as well as hardware-implemented methods, signal processing circuits, image sensor circuits, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as flowcharts, data tables, and system configurations. It will be readily apparent to one skilled in the art that these specific details are merely exemplary and not intended to limit the scope of this application.

Moreover, while the present disclosure focuses mainly on examples in which the S/H circuits are used in image sensors, it will be understood that this is merely one example of an implementation. It will further be understood that the disclosed S/H circuits can be used in any device in which there is a need to sample a signal and/or compare two voltages; for example, an audio signal processing circuit, industrial measurement and control circuit, and so on.

In this manner, the present disclosure provides for improvements in the technical field of signal processing, as well as in the related technical fields of image sensing and image processing.

[Sample-and-Hold Circuit]

Figure 2:
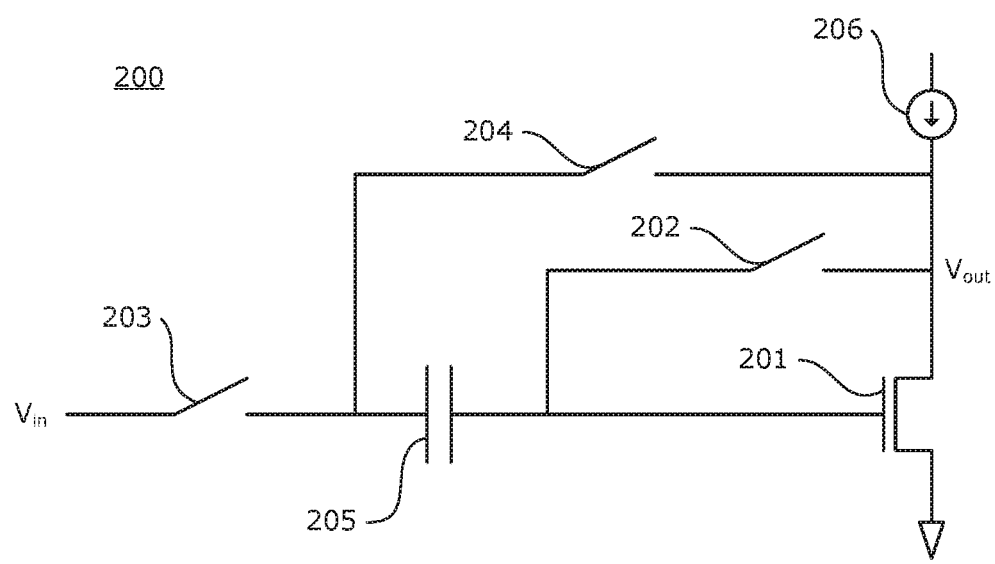
FIG. 2 illustrates an exemplary S/H circuit according to various aspects of the present disclosure.

FIG. 2 illustrates an exemplary analog S/H circuit 200, of a bottom plate sampling type. This illustrative S/H circuit comprises an NMOS transistor 201, switches 202-204, a sampling capacitor 205, and a current source 206. In this example, $V_{ref}$ is a reference voltage and $V_{in}$ is the input analog voltage (that is, the input signal) to be sampled. In an image sensor implementation, $V_{in}$ represents a pixel value. The switches 202-204 are preferably transistors, such as CMOS transistors.

Figure 3:
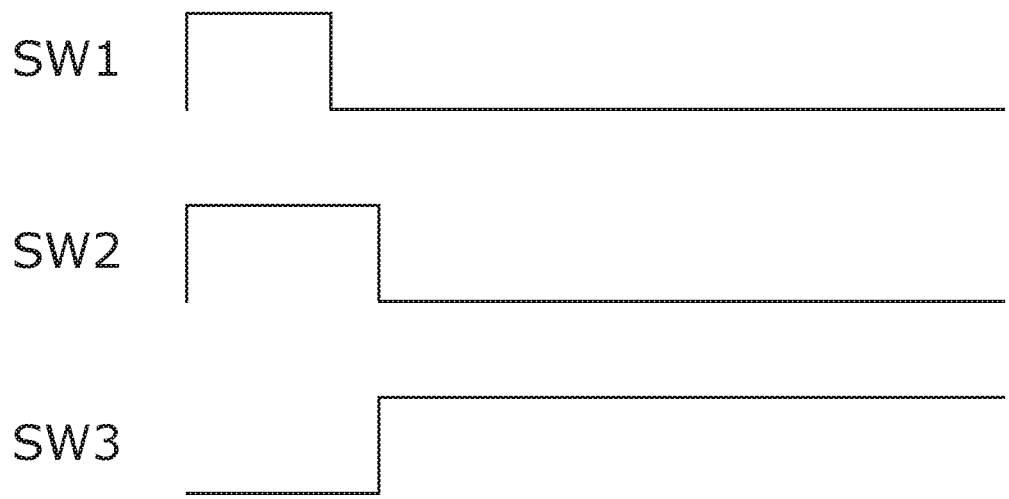
FIG. 3 illustrates an exemplary signal timing diagram of the exemplary S/H circuit according to FIG. 2.

In operation, the switches 202-204 are controlled according to a particular timing by control signals SW1-SW3. That is, the switch 202 is controlled by a control signal SW1, the switch 203 is controlled by a control signal SW2, and the switch 204 is controlled by a control signal SW3. FIG. 3 illustrates an exemplary timing diagram for the operation of the S/H circuit 200, and shows the respective waveforms of the control signals SW1-SW3. In FIG. 3, for purposes of illustration, "high" signals indicate "closed" (i.e., connected) switches and "low" signals indicate "open" (i.e., disconnected) switches.

At the beginning of the illustrated period, the signal $V_{in}$ is sampled. During this period, the signals SW1 and SW2 are high and the signal SW3 is low. Thus, the switches 202 and 203 are closed, whereas the switch 204 is open. This causes the sampling capacitor 205 to be charged to the voltage $V_{in}(t1)-V_{ref}$, where t1 is the time where the sampling capacitor 205 is charged. After the sampling capacitor 205 has been charged, the signal SW1 becomes low, while the signal SW2 remains high and the signal SW3 remains low. Thus, the switch 202 is opened, while the switch 203 remains closed and the switch 204 remains open. This disconnects the feedback path of the transistor 201. The voltage at the sampling capacitor 205 remains at the level of the previous stage, i.e. $V_{in}(t1)-V_{ref}$. Then, the signals SW2 and SW3 are reversed. That is, while the switch 202 remains open, the switch 203 becomes open and the switch 204 becomes closed. The voltage $V_c$ on the sampling capacitor 205 and the feedback connection on the transistor 201 cause the output voltage $V_{out}$ to be the same as $V_{in}$. That is, $V_{out}=V_c+V_{ref}=V_{in}(t1)-V_{ref}+V_{ref}=V_{in}(t1)$.

Figure 4:
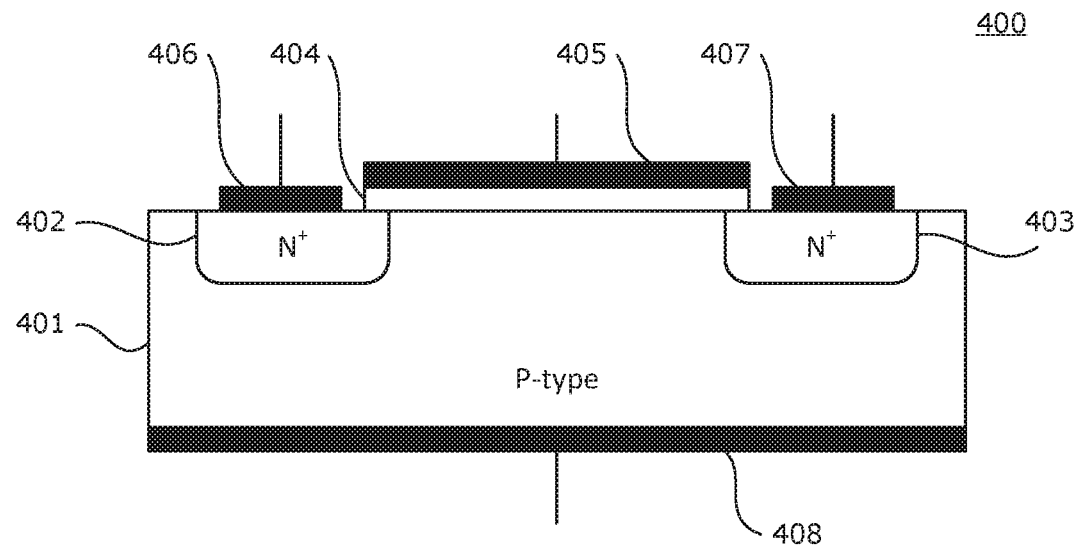
FIG. 4 illustrates an exemplary NMOS transistor according to various aspects of the present disclosure.

FIG. 4 illustrates an exemplary NMOS transistor 400. The NMOS transistor 400 comprises a silicon substrate 401, a gate oxide 404, a gate terminal 405, a source terminal 406, a drain terminal 407, and a body terminal 408 (sometimes called a "substrate terminal"). The substrate 401 is of P type, and the source and drain terminals 406 and 407 are respectively disposed above N$^+$ type regions 402 and 403.

In the NMOS transistor 400, the mode of operation depends on the gate voltage. When the gate voltage is such that the gate-source voltage $V_{GS}$ is larger than a threshold voltage $V_T$, an inversion layer with an abundance of electrons is formed in the channel between the source and the gate. As a result, current flows from the drain to the source when the drain voltage $V_D$ is higher than the source voltage $V_S$. This is referred to as the "inversion mode" or "conducting mode." When $V_{GS}$ is lower than $-V_{FB}$, where $V_{FB}$ is a "flat-band" voltage, a layer of holes accumulates on the surface of the P-type substrate near the gate. In this case the path from the source to the drain via the layer of holes behaves like two diodes with opposite polarities connected in series. As a result, no current can flow between the source and the drain regardless of the source to drain voltage difference. This is referred to as the "accumulation mode." When $V_{GS}$ is between $-V_{FB}$ and $V_T$, there is a deficit of electrons and holes in the channel, which results in a high resistance such that drain current cannot flow. This is referred to as the "depletion mode."

Figure 5:
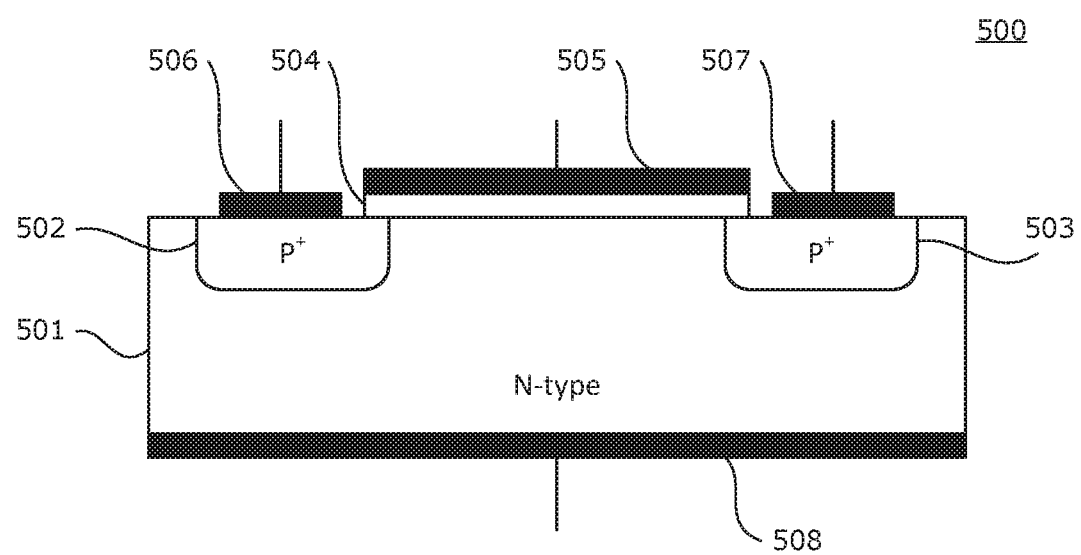
FIG. 5 illustrates an exemplary PMOS transistor according to various aspects of the present disclosure.

FIG. 5 illustrates an exemplary PMOS transistor 500, for which a similar analysis holds true. The PMOS transistor 500 comprises a silicon substrate 501, a gate oxide 504, a gate terminal 505, a source terminal 506, a drain terminal 507, and a body terminal 508. The substrate 501 is of N type, and the source and drain terminals 506 and 507 are respectively disposed above P$^+$ type regions 502 and 503. In other words, the PMOS transistor 500 is similar to the NMOS transistor 400 except that the types of semiconductor doping are reversed (e.g., P types become N types, etc.), and the polarities of the voltages are also reversed. Thus, the PMOS transistor 500 is in the inversion mode when $V_{GS}<-V_T$, and is in the accumulation mode when $V_{GS}>V_{FB}$. In the above analyses, $V_{GS}$ and $V_T$ are defined to be positive values for ease of notation, regardless of whether the transistor is of a PMOS type or an NMOS type.

RTS and 1/f noise in a transistor can be reduced by periodically switching the transistor from the inversion mode to the accumulation mode. That is, by interposing periods of gate bias corresponding to accumulation between periods of gate bias corresponding to inversion, low-frequency noise sampled during the inversion periods is reduced. This results in a decrease of RTS noise in the MOSFET.

[Periodic Switching]

Therefore, periodically switching the MOS transistor in an S/H circuit between the inversion mode and the accumulation mode is associated with a reduction in the noise associated with the transistor. In particular, the MOS transistor acting as an amplifier in an S/H circuit is switched to the inversion mode so that the S/H circuit functions normally to sample the analog input signal. Periodically, this transistor is switched to the accumulation mode. For example, the transistor is switched to the accumulation mode during a time when the active connection of the circuit is moving from one pixel row to another; that is, a time during which the S/H circuit is not sampling. When the transistor is subsequently switched back from the accumulation mode to the inversion mode, the S/H circuit operates to provide a lower RTS noise level.

Figure 6:
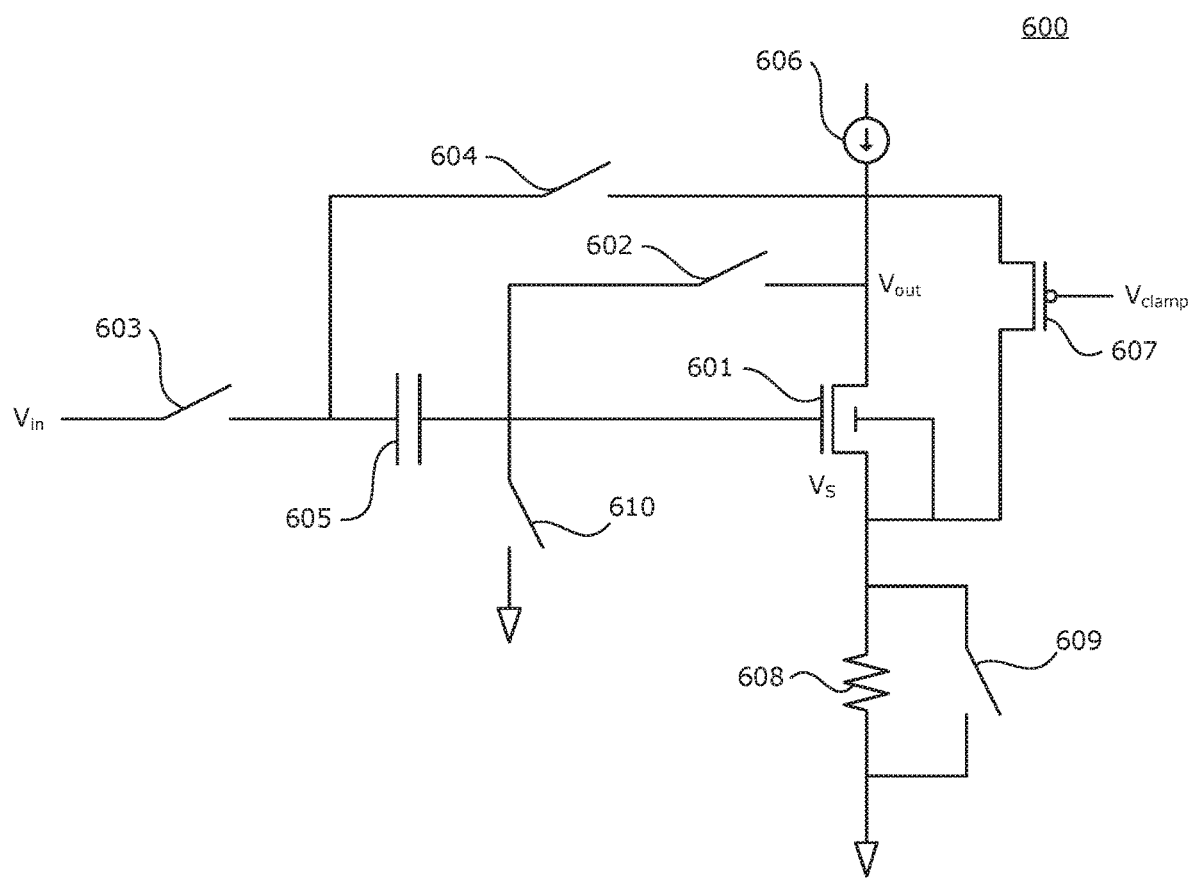
FIG. 6 illustrates another exemplary S/H circuit according to various aspects of the present disclosure.

To effect this switching, the S/H circuit of FIG. 2 is modified, as illustrated in FIG. 6. In FIG. 6, S/H circuit 600 includes an amplifier transistor 601, switches 602-604 and 609-610, a sampling capacitor 605, a current source 606, a clamping transistor 607, and a resistor 608. In this illustration, the amplifier transistor 601 is an NMOS transistor (for example, transistor 400) and the clamping transistor 607 is a PMOS transistor (for example, transistor 500). The body terminal of the amplifier transistor 601 is connected to the source terminal of the amplifier transistor 601, and the gate terminal of the clamping transistor 607 receives a voltage $V_{clamp}$. The clamping transistor 607 is connected between the current source 606 and the source terminal of the amplifier transistor 601. The resistor 608 and the switch 609 are connected in parallel between the source terminal of the amplifier transistor 601 and a predetermined voltage (for example, ground). The switch 610 is connected between the predetermined voltage the gate terminal of the amplifier transistor 601. During operation of the S/H circuit 600, the switches 609-610 are operated such that they are always in opposite states. That is, when the switch 609 is on (closed), the switch 610 is off (open), and vice versa.

Figure 7:
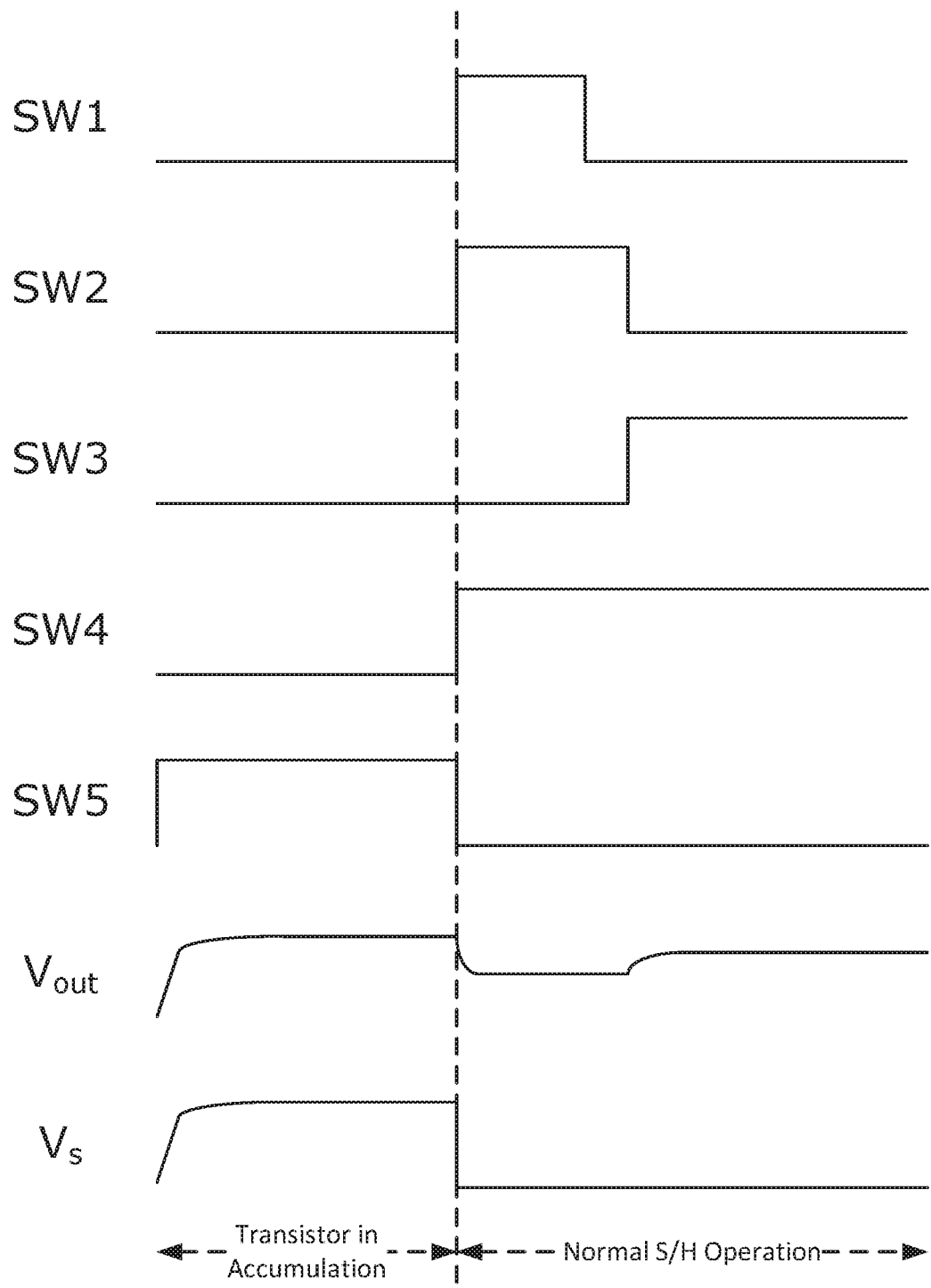
FIG. 7 illustrates an exemplary signal timing diagram of the exemplary S/H circuit according to FIG. 6.

FIG. 7 illustrates an exemplary timing diagram for the S/H circuit 600. In the illustration of FIG. 7, SW1 is a control signal of the switch 602, SW2 is a control signal of the switch 603, SW3 is a control signal of the switch 604, SW4 is a control signal of the switch 609, and SW5 is a control signal of the switch 610. Additionally, FIG. 7 illustrates an exemplary waveform for $V_{out}$ and for $V_S$, the source voltage of amplifier transistor 601.

Figure 8:
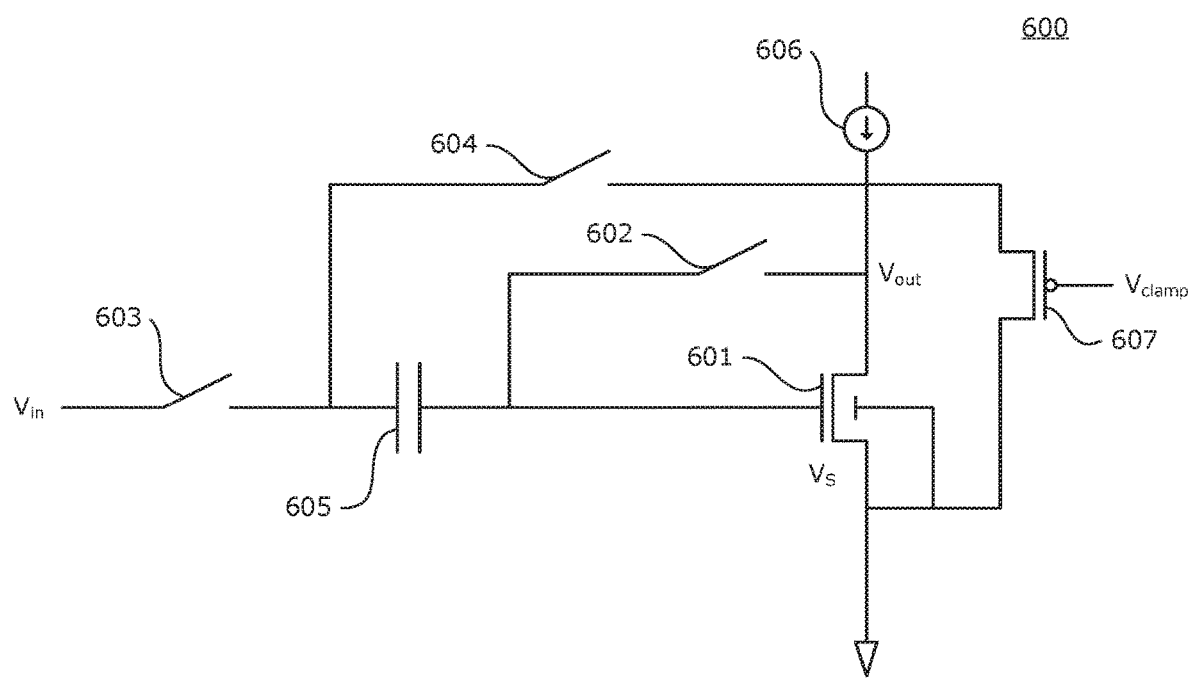
FIG. 8 illustrates an operation of the exemplary S/H circuit according to FIG. 6.

FIG. 8 illustrates the S/H circuit 600 during a normal S/H operation, where the switch 609 is in the closed position and the switch 610 is in the open position. Thus, FIG. 8 corresponds to a state of the S/H circuit 600 during the "Normal S/H Operation" period illustrated in FIG. 7. In the illustration of FIG. 8, $V_{clamp}$ is set to a constant level such that the clamping transistor 607 is not conducting. In this case, the S/H circuit 600 operates in a manner similar to the S/H circuit 200 of FIG. 2. Thus, during the normal S/H operation of the S/H circuit 600, the switches 602-605 operate according to the timing sequence of control signals SW1-SW3, respectively, as illustrated in FIG. 3. Thus, the particular operations are not repeated here. In this operation, the amplifier transistor 601 is in the inversion mode.

Figure 9:
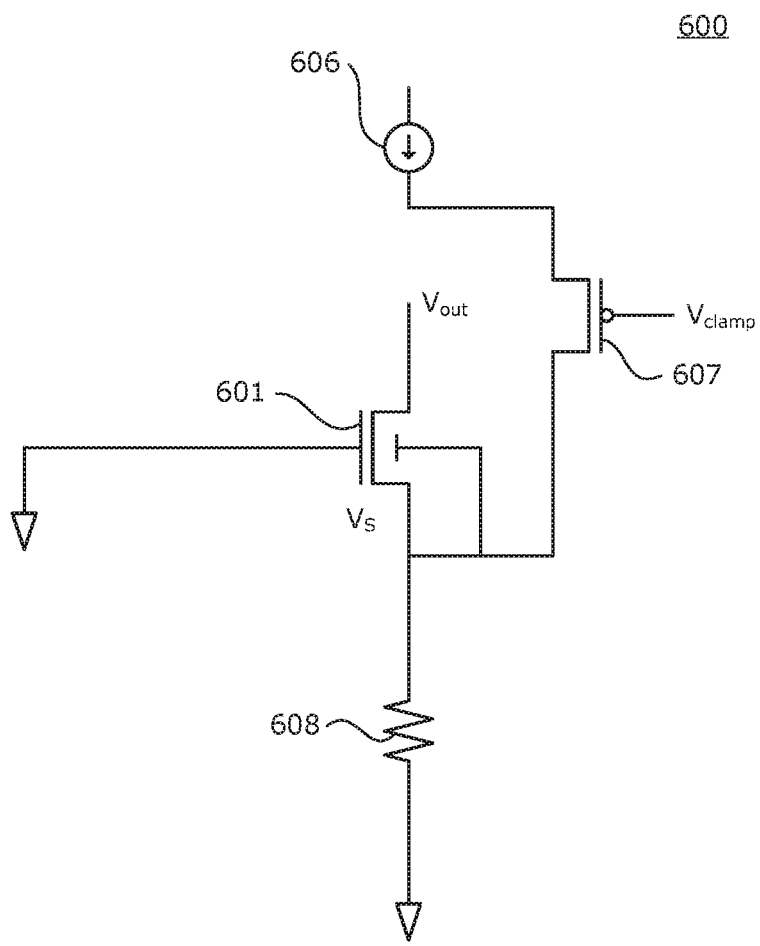
FIG. 9 illustrates another operation of the exemplary S/H circuit according to FIG. 6.

FIG. 9 illustrates the S/H circuit 600 when not sampling, where the switch 609 is in the opened position and the switch 610 is in the closed position. Thus, FIG. 9 corresponds to a state of the S/H circuit 600 during the "Transistor in Accumulation" period illustrated in FIG. 7. $V_{clamp}$ is set to a level such that the clamping transistor 607 is conducting, and the current flowing through the resistor 608 is the current I provided by the current source 606. Immediately after switching into this state, the current I flowing through the resistor 608 causes the source voltage $V_S$ of the amplifier transistor 601 to take a positive value $V_S=I\times R$, where R is the resistance of resistor 608. The S/H circuit 600 is designed such that $V_S > V_{clamp} + V_T$ for the clamping transistor 607. In this case, the clamping transistor 607 is in the on state to maintain the current I flowing through the resistor 608, thus maintaining the relationship $V_S=I\times R$.

During this operation the drain voltage (which is equivalent to $V_{out}$) of transistor 607 is set up by the IR drop in the resistor 608, whereas the source voltage of transistor 607 is equal to $V_{clamp}+V_T+V_{on}$, which is the transistor on voltage. The source voltage $V_S$ of the amplifier transistor 601 is at a positive value (as described above) while the gate voltage is at ground. The S/H circuit 600 is designed such that $V_S > V_{FB}$ for the amplifier transistor 601. Thus, the condition $V_{GS} < -V_{FB}$ is satisfied, and the amplifier transistor 601 operates in the accumulation mode.

[Image Sensor Operation]

In a practical implementation, there are a large number of individual pixels and thus many S/H circuits working in parallel. Each S/H circuit in the image sensor is shared by multiple pixels; for example, a column or multiple columns of pixels may share a single S/H circuit, a rectangular block of pixels may share an S/H circuit, and the like. To incorporate the periodic switching described above, it is thus necessary to appropriately control each S/H circuit in the image sensor. This may be accomplished using a control signal that controls the sequential operation of the image sensor.

Figure 1:
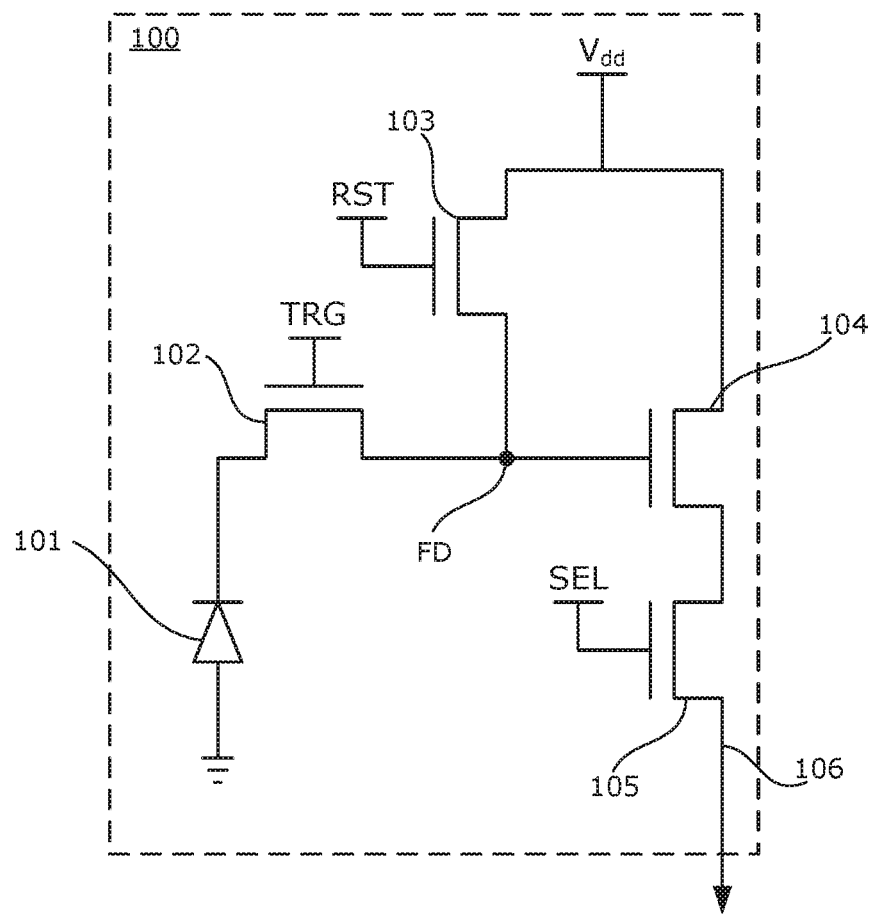
FIG. 1 illustrates an exemplary pixel circuit for use with various aspects of the present disclosure.
Figure 10:
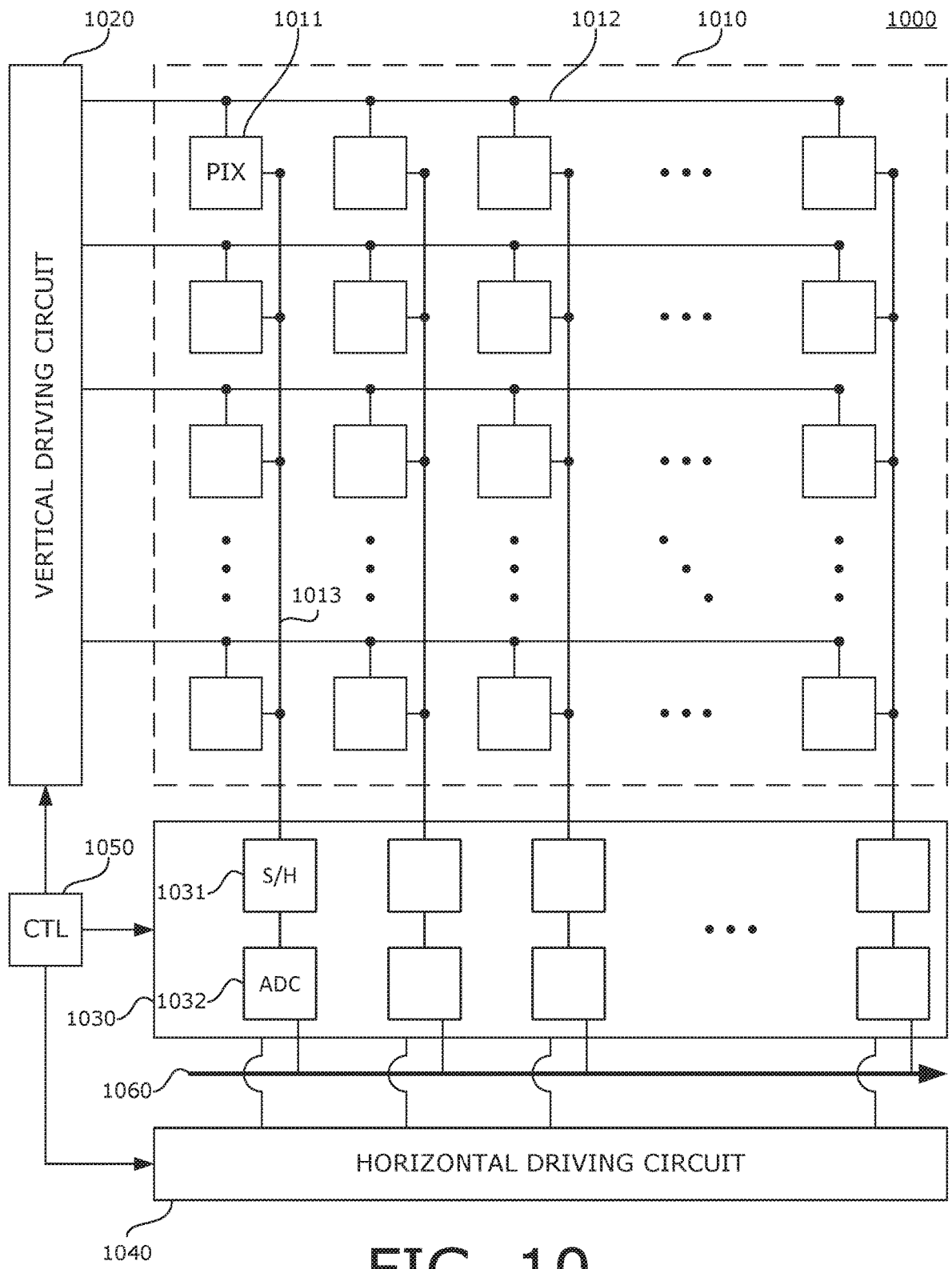
FIG. 10 illustrates an exemplary image sensor according to various aspects of the present disclosure.

FIG. 10 illustrates an exemplary image sensor 1000 that implements mode switching in a column sharing architecture, where each column of pixels shares a single S/H circuit and ADC. Image sensor 1000 includes an array 1010 of pixels 1011. The pixels 1011 may, for example, be similar or identical to the pixel 100 illustrated in FIG. 1. The pixels 1011 are located at intersections where horizontal signal lines 1012 and vertical signal lines 1013 cross one another. The horizontal signal lines 1012 are operatively connected to a vertical driving circuit 1020, also known as a "row scanning circuit," at a point outside of the pixel array, and carry signals from the vertical driving circuit 1020 to a particular row of the pixels 1011. The pixels 1011 in a particular column output an analog signal corresponding to an amount of incident light to the vertical signal line 1013. For illustration purposes, only a small number of the pixels 1011 are actually shown in FIG. 10; however, in practice the image sensor 1000 may have up to tens of millions of pixels ("megapixels" or MP) or more.

The vertical signal line 1013 conducts the analog signal for a particular column to a column circuit 1030. While FIG. 10 illustrates one vertical signal line 1013 for each column in the pixel array 1010, the present disclosure is not so limited. For example, more than one vertical signal line 1013 may be provided for each column, or each vertical signal line 1013 may correspond to more than on column. In any case, the column circuit 1030 preferably includes a plurality of S/H circuits 1031 and ADC circuits 1032. Individual S/H circuits 1031 may, for example, be similar or identical to the S/H circuits 600 illustrated in FIGS. 6-9. Other possible circuit components of the column circuit 1030, such as voltage-to-current (V2I) circuits, counters, and the like, are omitted from the illustration of FIG. 10 for clarity purposes.

The column circuit 1030 is controlled by a horizontal driving circuit 1040, also known as a "column scanning circuit." Each of the vertical driving circuit 1020, the column circuit 1030, and the horizontal driving circuit 1040 receive one or more clock signals from a controller 1050. The controller 1050 controls the timing and operation of various image sensor components such that analog signals from the pixel array 1010, having been converted to digital signals in the column circuit 1030, are output via an output circuit 1060 for signal processing, storage, transmission, and the like.

During the readout process, the pixels 1011 in each row are read together, and the pixels 1011 in different rows are read in a row-by-row sequential basis. At the beginning of the processing period, a row of the pixels 1011 are connected to the S/H circuits 1031 via the vertical signal lines 1013. The S/H circuits 1031 and the ADC circuits 1032 respectively sample and convert a row of the pixels 1011 into digital form. After a row of the pixels 1011 has been processed, the image sensor 1000 turns to the next row of the pixels 1011 and the process is repeated. This is continued until the entire frame is read out.

Figure 11:
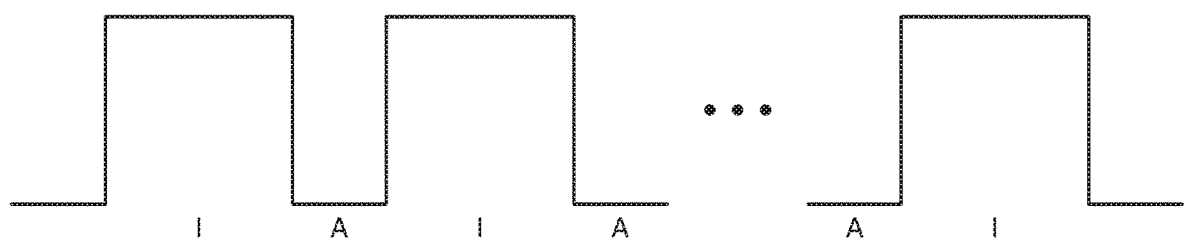
FIG. 11 illustrates an exemplary timing diagram according to various aspects of the present disclosure.

FIG. 11 illustrates a timing diagram for switching the MOS transistors in S/H circuits (for example, the amplifier transistors 601 in S/H circuits 600/1031 illustrated in FIGS. 6-10) periodically between the inversion mode and the accumulation mode. In FIG. 11, the periods along the horizontal time axis represented by the letter "I" are periods where the amplifier transistor 601 is in an inversion mode (i.e., where the switch 609 is on and the switch 610 is off in each S/H circuit 600). During this time, the column circuit 1030 is controlled such that one row of pixels are read and converted to digital form. After this operation, the switch 609 is turned off and the switch 610 is turned on. These periods, represented by the letter "A," are periods where the amplifier transistor 601 is in an accumulation mode. After a predetermined duration of time, the positions of the switches 609-610 are again reversed such that the amplifier transistor 601 is switched back to the inversion mode. At this time, a subsequent row of the pixels 1011 are read and the output thereof is converted to digital form. The process of switching periodically between "I" and "A" periods is repeated until the pixels 1011 from the entire frame are read and converted.

In the particular illustration of FIG. 11, the time duration of the "A" periods is shown to be smaller than the time duration of the "I" periods. However, in actual implementations a number of factors are considered in determining the relative durations. Some such factors include the readout time of the pixels, the settling time of the circuits, a threshold time in accumulation for RTS reduction to be effective, the frame rate of the image sensor, and the like. Thus, the actual time durations for "I" and "A" periods is chosen to optimize the overall performance of the image sensor. Furthermore, while FIG. 11 illustrates a process during which the S/H circuit is switched to accumulation mode after the readout and conversion of each pixel row, it is also possible to switch to accumulation mode after several rows of pixels have been read and converted.

CONCLUSION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A sample-and-hold circuit, comprising:
    an amplifier transistor of a first conductivity type; and
    a clamping transistor of a second conductivity type opposite the first conductivity type, wherein
    the clamping transistor is connected between a source terminal of the amplifier transistor and a drain terminal of the amplifier transistor, and
    a body terminal of the amplifier transistor is connected to the source terminal of the amplifier transistor and to a predetermined voltage, or to the drain terminal of the amplifier transistor and to the predetermined voltage.

2. The sample-and-hold circuit according to claim 1, wherein the amplifier transistor is switched between an inversion mode and an accumulation mode in an alternating manner.

3. The sample-and-hold circuit according to claim 2, wherein, in the inversion mode, a gate terminal of the clamping transistor is configured to receive a constant clamping voltage such that the clamping transistor is not conducting.

4. The sample-and-hold circuit according to claim 2, wherein, in the accumulation mode, a gate terminal of the clamping transistor is configured to receive a clamping voltage such that the clamping transistor is conducting.

5. The sample-and-hold circuit according to claim 3, wherein, in the accumulation mode, a gate terminal of the amplifier transistor is connected to the predetermined voltage.

6. The sample-and-hold circuit according to claim 5, wherein, in the accumulation mode, the drain terminal of the amplifier transistor and a source terminal of the clamping transistor are connected to a current source.

7. The sample-and-hold circuit according to claim 1, wherein a gate terminal of the clamping transistor is configured to receive a clamping voltage that is switched between a first level and a second level.

8. The sample-and-hold circuit according to claim 1, wherein the amplifier transistor is an NMOS transistor and the clamping transistor is a PMOS transistor.

9. The sample-and-hold circuit according to claim 1, wherein the amplifier transistor is a PMOS transistor and the clamping transistor is an NMOS transistor.

10. The sample-and-hold circuit according to claim 1, wherein the drain terminal of the amplifier transistor or the source terminal of the amplifier transistor is connected to an output node of the sample-and-hold circuit.

11. An image sensor, comprising:
a pixel circuit configured to configured to convert incident light into an analog signal; and
a sample-and-hold circuit configured to receive the analog signal, the sample-and-hold-circuit including:
an amplifier transistor of a first conductivity type; and
a clamping transistor of a second conductivity type opposite the first conductivity type, wherein
the clamping transistor is connected between a source terminal of the amplifier transistor and a drain terminal of the amplifier transistor, and
a body terminal of the amplifier transistor is connected to the source terminal of the amplifier transistor and to a predetermined voltage, or to the drain terminal of the amplifier transistor and to the predetermined voltage.

12. The image sensor according to claim 11, wherein the amplifier transistor is switched between an inversion mode and an accumulation mode in an alternating manner.

13. The image sensor according to claim 12, wherein, in the inversion mode, a gate terminal of the clamping transistor is configured to receive a constant clamping voltage such that the clamping transistor is not conducting.

14. The image sensor according to claim 12, wherein, in the accumulation mode, a gate terminal of the clamping transistor is configured to receive a clamping voltage such that the clamping transistor is conducting.

15. The image sensor according to claim 13, wherein, in the accumulation mode, a gate terminal of the amplifier transistor is connected to the predetermined voltage.

16. The image sensor according to claim 15, wherein, in the accumulation mode, the drain terminal of the amplifier transistor and a source terminal of the clamping transistor are connected to a current source.

17. The image sensor according to claim 11, wherein a gate terminal of the clamping transistor is configured to receive a clamping voltage that is switched between a first level and a second level.

18. The image sensor according to claim 11, wherein the amplifier transistor is an NMOS transistor and the clamping transistor is a PMOS transistor.

19. The image sensor according to claim 11, wherein the amplifier transistor is a PMOS transistor and the clamping transistor is an NMOS transistor.

20. The image sensor according to claim 11, wherein the drain terminal of the amplifier transistor or the source terminal of the amplifier transistor is connected to an output node of the sample-and-hold circuit.

* * * * *